(12) United States Patent
Bell et al.

(10) Patent No.: US 8,010,334 B2
(45) Date of Patent: Aug. 30, 2011

(54) METHOD AND APPARATUS FOR EVALUATING INTEGRATED CIRCUIT DESIGN PERFORMANCE USING BASIC BLOCK VECTORS, CYCLES PER INSTRUCTION (CPI) INFORMATION AND MICROARCHITECTURE DEPENDENT INFORMATION

(75) Inventors: Robert H Bell, Austin, TX (US);
Thomas W Chen, Jr., Austin, TX (US);
Venkat R Indukuru, Austin, TX (US);
Alex E Mericas, Austin, TX (US);
Pattabi M Seshadri, Austin, TX (US);
Madhavi G Valluri, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 12/112,034

(22) Filed: Apr. 30, 2008

(65) Prior Publication Data

US 2009/0276190 A1    Nov. 5, 2009

(51) Int. Cl.
*G06F 17/50* (2006.01)

(52) U.S. Cl. ......................................................... 703/13
(58) Field of Classification Search ...................... 703/13
See application file for complete search history.

(56) References Cited

U.S. PATENT DOCUMENTS

| | | | |
|---|---|---|---|
| 4,266,270 A | 5/1981 | Daniels | |
| 5,263,153 A | 11/1993 | Intrater | |
| 5,938,760 A | 8/1999 | Levine | |
| 5,961,654 A | 10/1999 | Levine | |
| 6,047,367 A | 4/2000 | Heller | |
| 6,085,338 A | 7/2000 | Levine | |

OTHER PUBLICATIONS

"CPI analysis on POWER5, Part 2: Introducing the CPI breakdown model", Apr. 25, 2006, downloaded from https://www.ibm.com/developerworks/power/library/pa-cpipower2, 12 pages.*
Lieven Eeckhout et al., "Accurate statistical approaches for generating representative workload compositions", 2005, 2005 IEEE Workload characterization Symposium, pp. 56-66.*
Wikipedia—"K-Means Algorithm"—Online Wikipedia Reference Material (Dec. 2007).
Robinson—"Initial Starting Point Analysis for K-Means clustering: A Case Study"—Proceedings of ALAR 2006 Conference on Applied Research in Information Technology (Mar. 2006).
Hamerly-1—"SimPoint 3.0: Faster and More Flexible Program Analysis"—Dept Computer Science and Engineering UC San Diego (Sep. 2005).

(Continued)

*Primary Examiner* — Paul L Rodriguez
*Assistant Examiner* — Russ Guill
(74) *Attorney, Agent, or Firm* — Matt Talpis; Mark P Kahler

(57) ABSTRACT

A test system or simulator includes an integrated circuit (IC) benchmark software program that executes workload program software on a semiconductor die IC design model. The benchmark software program includes trace, simulation point, basic block vector (BBV) generation, cycles per instruction (CPI) error, clustering and other programs. The test system also includes CPI stack program software that generates CPI stack data that includes microarchitecture dependent information for each instruction interval of workload program software. The CPI stack data may also include an overall analysis of CPI data for the entire workload program. IC designers may utilize the benchmark software and CPI stack program to develop a reduced representative workload program that includes CPI data as well as microarchitecture dependent information.

20 Claims, 7 Drawing Sheets

OTHER PUBLICATIONS

Hamerly-2—"How to Use SimPoint to Pick Simulation Points"—Dept Computer Science and Engineering UC San Diego (Mar. 2004).

Anderson—"Continuous Profiling: Where Have All The Cycles Gone?"—Digital Equipment Corporation (Oct. 13, 1999).

Eyerman—"A Performance Counter Architecture for Computing Accurate CPI Components"—Proceedings of the 12th International Conference on Architectural Support for Programming Languages and Operating Systems (2006).

Azimi—"Online Performance Analysis by Statistical Sampling of Microprocessor Performance Counters"—Proceedings of the 19th Annual International Conference on Supercomputing (2005).

Luo—"Automaticaliy Selecting Representative Traces for Simulation Based on Cluster Analysis of Instruction Address Hashes"—The University of Texas at Austin IBM Server Group (2005).

Wunderlich-1—"An Evaluation of Stratified Sampling of Microarchitecture Simulations"—Computer Architecture Laboratory ISCA-31 (Jun. 2004).

Wunderlich-2—"Smarts: Accelerating Microarchitecture Simulation via Rigorous Statistical Sampling"— International Symposium on Computer Architecture ISCA-30 (Jun. 2003).

Wunderlich-3—"TurboSmarts: Accurate Microarchitecture Simulation Sampling in Minutes"—Computer Architecture Lab at Carnegie Mellon CALCM (2004).

Taufer—"Scalability and Resource Usage of an OLAP Benchmark on Cluster of PCs"—Proceedings of 14th Annual ACM Symposium on Parallel Algorithms and Architectures (2002).

Puzak—"An Analysis of the Effects of Miss Clustering on the Cost of a Cache Miss"—IBM SIGMICRO— (2007).

Annavaram—"The Fuzzy Correlation between Code and Performance Predictability"—Proceedings of the 37th International Symposium on Microarchitecture (2004).

Lau-1—"Transition Phase Classification and Prediction"—11th International Symposium on High Performance Computer Architecture, Feb. 2005.

Lau-2—"The Strong Correlation Between Code Signatures and Performance"—IEEE International Symposium on Performance Analysis of Systems and Software, Mar. 2005.

Laurenzano—"Low Cost Trace-driven Memory Simulation Using SimPoint"—Workshop on Binary Instrumentation and Applications (held in conjunction with PACT2005), St. Louis, MO Sep. 2005.

Pereira—"Dynamic Phase Analysis for Cycle-Close Trace Generation"—International Conference on Hardware/Software Codesign and System Synthesis, Sep. 2005.

Sherwood-1—"Basic Block Distribution Analysis to Find Periodic Behavior and Simulation Points in Applications" In Proceedings of the International Conference on Parallel Architectures and Compilation Techniques (PACT), Sep. 2001.

Sherwood-2—"Automatically Characterizing Large Scale Program Behavior"—Architectural Support for Programming Languages and Operating Systems ASPLOS at University of California, San Diego (2002).

Iyengar—"Representative Traces for Processor Models with Infinite Cache"—IBM Research Division presented at the International Symposium on High Performance Computer Architecture HPCA (2005).

Perelman—"Picking Statistically Valid and Early Simulation Points"—Proceedings of the International Conference on Parallel Architectures and Compilation Techniques PACT (Sep. 2003).

SimPoint—"SimPoint Overview"—downloaded from http://www.cse.ucsd.edu/~calder/simpoint/phase_analysis.htm on Oct. 20, 2007.

* cited by examiner (PRIOR ART) 100

SUBSET OR INSTRUCTION SEGMENT OF MUCH LARGER WORKLOAD PROGRAM COMPILED LINES OF CODE

FIG. 3
(PRIOR ART)

300
CONVENTIONAL BASIC BLOCK VECTOR FORMAT FROM GENERATION METHOD USING BASIC BLOCK COUNTS OF WORKLOAD PROGRAM EXECUTING WITH CONVENTIONAL BENCHMARK SOFTWARE

| | 310-0 | 310-1 | 310-2 | | 310<br>310-63 | |
|---|---|---|---|---|---|---|
| BASIC BLOCK VECTOR 1 (BBV1) | BB1-0 | BB1-1 | BB1-2 | ••• | BB1-63 | INSTRUCTION INTERVAL 1 = 1$^{ST}$ 1 MILLION INSTRUCTIONS |
| | 380 | 220 | 140 | ••• | 280 | |

| | 320-0 | 320-1 | 320-2 | | 320<br>320-63 | |
|---|---|---|---|---|---|---|
| BASIC BLOCK VECTOR 2 (BBV2) | BB2-0 | BB2-1 | BB2-2 | ••• | BB2-63 | INSTRUCTION INTERVAL 2 = 2$^{nd}$ 1 MILLION INSTRUCTIONS |
| | 180 | 120 | 340 | ••• | 175 | |

⋮

| | | | | | 330 | |
|---|---|---|---|---|---|---|
| BASIC BLOCK VECTOR N (BBVN) | BBN-0 | BBN-1 | BBN-2 | ••• | BBN-X | INSTRUCTION INTERVAL N = FINAL 1 MILLION INSTRUCTIONS |
| | | | | ••• | | |

600
CPI STACK DIAGRAM FROM CPI STACK PROGRAM
EXECUTION AND ANALYSIS OF WORKLOAD
PROGRAM ON AN IC DESIGN MODEL

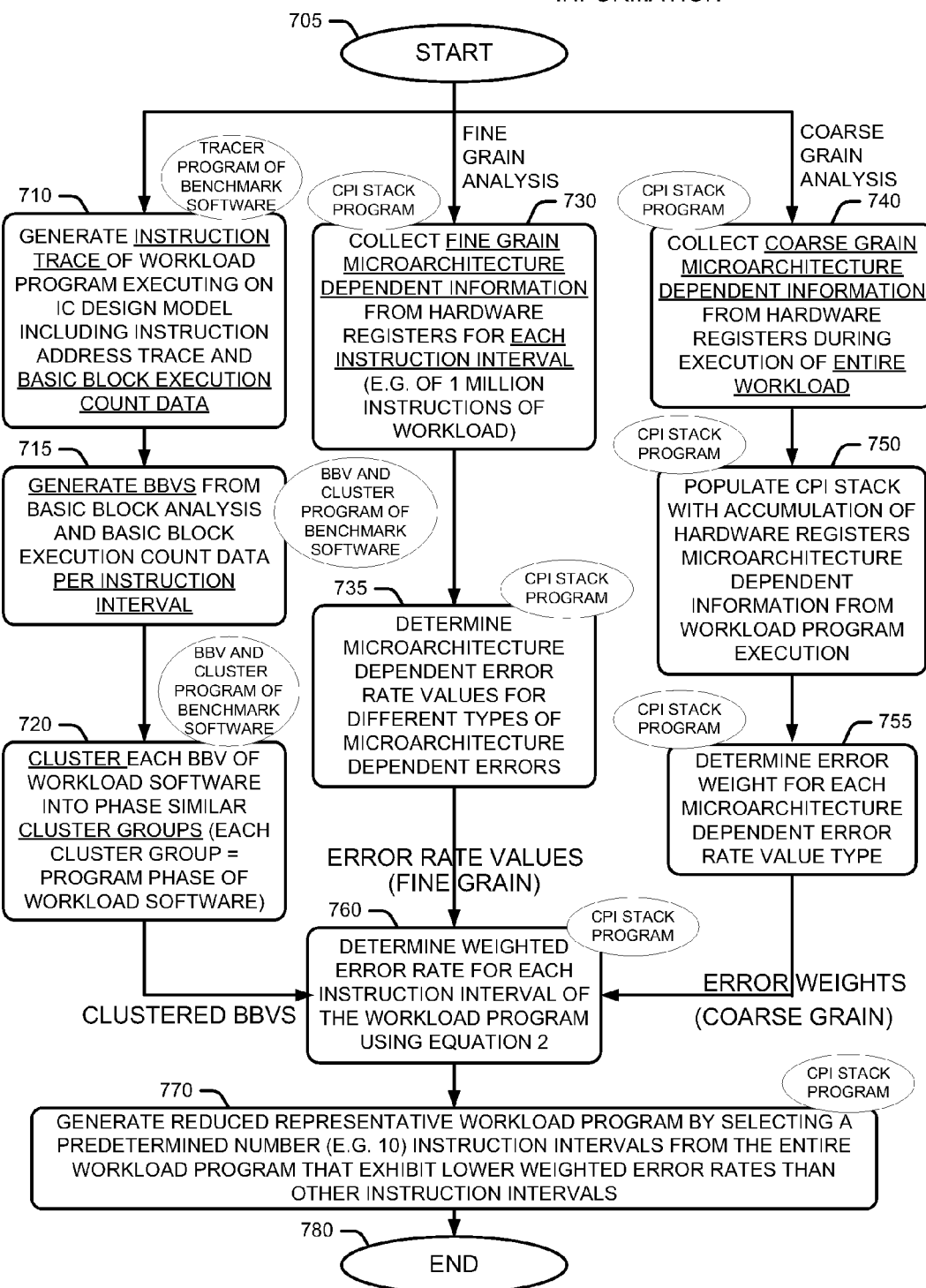

METHOD AND APPARATUS FOR EVALUATING INTEGRATED CIRCUIT DESIGN PERFORMANCE USING BASIC BLOCK VECTORS, CYCLES PER INSTRUCTION (CPI) INFORMATION AND MICROARCHITECTURE DEPENDENT INFORMATION

TECHNICAL FIELD OF THE INVENTION

The disclosures herein relate generally to information handling systems (IHSs) that operate as electronic design test systems, and more particularly, to a methodology and apparatus for determining performance characteristics of processors and other devices within integrated circuits (ICs) during IC design.

BACKGROUND

A modern information handling system (IHS) may include a processor for processing, handling, communicating or otherwise manipulating information. These IHSs often include integrated circuits (ICs) that incorporate several components integrated together on a common semiconductor die. Some IHSs operate as test systems that evaluate the functionality and performance characteristics of other IC designs during the development process of the IC. A typical IC development process employs early design specifications that may include stringent requirements relating to the overall capability of the IC or other performance requirements. For example, a design requirement of a particular IC may demand that the IC operate without failure at a predetermined clock frequency. In another example, an IC design requirement may specify that a particular IC must execute standard benchmarking software to precise performance specifications.

With such rigorous requirements on IC design performance, designers often must develop extensive test strategies early in the IC development process. It is very common to apply these test strategies before the physical IC design hardware is complete. Designers develop computer or IC design models and test various parameters of the IC in a test simulation before actually fabricating the IC in hardware. The more detailed or accurate the IC design model for simulation, the more accurate the testing results become. However, more detailed IC models typically result in longer test application software execution times during testing.

Test strategies may involve extensive testing with large workload software application programs or test application software in a simulation environment. Test systems execute workload software application programs to benchmark or otherwise test parameters of the IC design, such as an IC design simulation model. Workload software application programs may include large numbers of instructions that often number in the trillions. Due to the large number of instructions in these workload software application programs, it may not be feasible to run or execute a workload software application program on an IC design model and still evaluate results in a timely manner. Hours of a typical workload software application program execution in a real world processor may correspond to months of execution time within a simulator.

What is needed is a testing methodology and apparatus that addresses the problems faced by IC designers as described above.

SUMMARY

Accordingly, in one embodiment, a method of testing an integrated circuit (IC) design is disclosed. The method includes executing, by a simulator test system, a first workload program on an IC design model. The method also includes generating, by the simulator test system, basic block vectors (BBVs) while executing the first workload program, each BBV corresponding to a respective BBV instruction interval of the first workload program. The method further includes clustering, by the simulator test system, the BBVs by program phase of the first workload program. The method still further includes storing, by the simulator test system, microarchitecture dependent error information that indicates microarchitecture dependent errors of different types that the simulator test system produces during the BBV instruction intervals of the first workload program. The method also includes generating, by the simulator test system, a weighted error rate including a cycles per instruction (CPI) error rate and weighted microarchitecture dependent error rate information.

In another embodiment, an integrated circuit (IC) design model simulator test system is disclosed. The test system includes a processor. The test system also includes a memory store, coupled to the processor, the memory store including an IC design model and a first workload program including instructions. The memory store is configured to execute the first workload program on the IC design model. The memory is also configured to generate basic block vectors (BBVs) while executing the first workload program, each BBV corresponding to a respective BBV instruction interval of the first workload program. The method is further configured to cluster the BBVs by program phase of the first workload program. The method is still further configured to store microarchitecture dependent error information that indicates microarchitecture dependent errors of different types that the simulator test system produces during the BBV instruction intervals of the first workload program. The memory is also configured to generate a weighted error rate including a cycles per instruction (CPI) error rate and weighted microarchitecture dependent error rate information.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 3 is a representation of multiple basic block vectors that one conventional IC design model evaluation methodology generates.

FIG. 7 is a flow chart that depicts the execution of CPI stack program software and workload program software on an IC design model that generates reduced representative workload program software in accordance with one embodiment of the disclosed methodology.

DETAILED DESCRIPTION

A particular grouping and interconnection of transistors on a semiconductor die of an integrated circuit (IC) may form a component such as an AND gate, OR gate, flip flop, multiplexer, or other component. Complex IC designs, such as a PowerPC (PPC) processor IC, may include billions of transistors or more. (PowerPC is a trademark of the IBM Corporation.) IC design and development includes the work of IC designers who generate detailed IC transistor, component, and interconnect schematics. IC designers develop software simulation models of a particular IC from these transistor, component, and interconnect schematics. Software simulation models are computer models or IC design models that depict the physical representation of a particular IC design in a virtual mode. By grouping transistors into components and interconnecting the components that form the detailed IC transistor and component schematics, designers develop an accurate IC design model that is usable in test simulation systems.

An IC design model may include a collection of components with input and output signal characteristics. In other words, each component of the IC design model may include a truth table or other mechanism to predict the output signals of the component that result from particular input signals. A computer simulation may execute or run using the IC design model by providing simulated input signals and predicting or calculating resultant output signals. Ultimately, the collection of input signals and resultant output signals provides a detailed timing signal simulation. Designers may compare the signal simulation against known good signal characteristics of the IC design and determine if the IC design model is performing properly. Designers may also stress an IC design by simulating an increase in clock frequency or providing workload program or other software applications that extensively test particularly sensitive areas of the IC design.

Simulation tools, such as "Simulation Program with Integrated Circuit Emphasis" (SPICE) software, originally a UC Berkeley development tool, are common tools of IC designers. SPICE may be particularly useful in the area of IC benchmark analysis. IC designers may use SPICE software to simulate analog and digital timing characteristics of the IC design under development. IC designers may use SPICE or other software to analyze an IC design to compare that design to IC design and performance requirements. It may be advantageous to provide benchmark analysis such as design and performance analysis prior to hardware production of the IC to avoid or shorten the costly process of building the IC, testing the IC, and redesigning the IC until achieving acceptable results. In one example, IC integrators use the output of the SPICE software or a collection of IC timing results as input into the IC benchmark process, such as the generation of a detailed IC design model.

Figure 1:
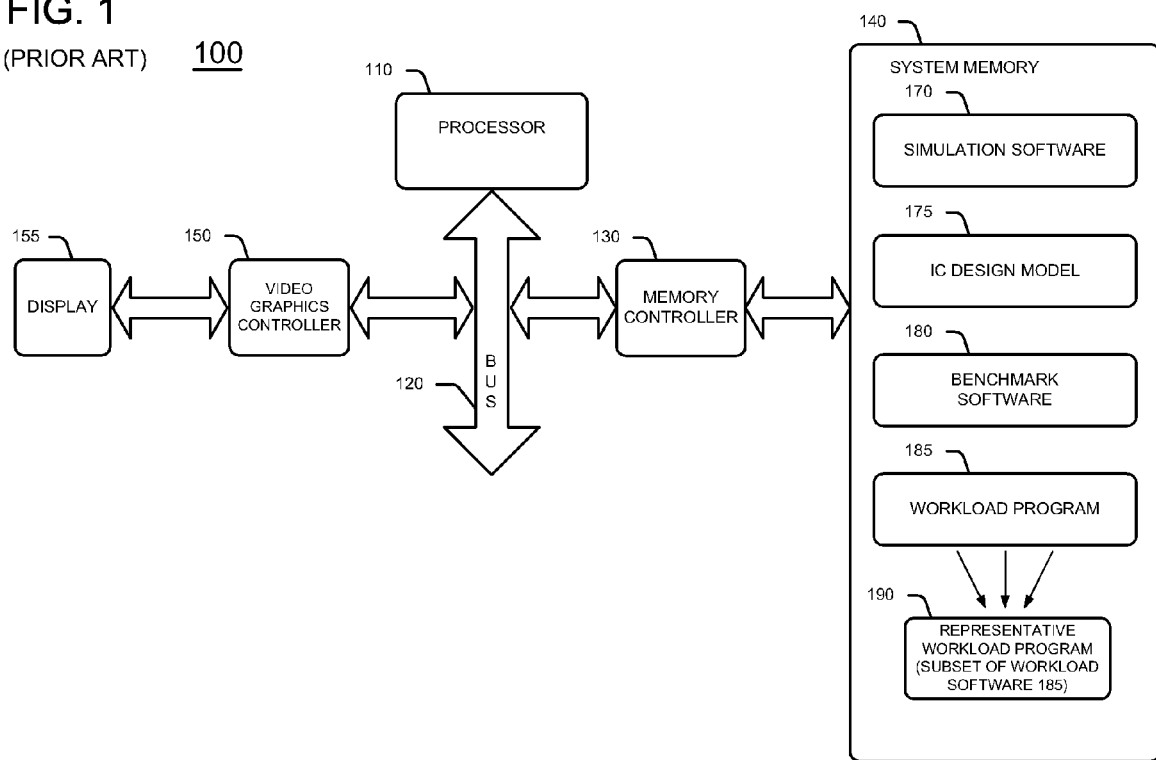
FIG. 1 is a block diagram of an information handling system that executes test application software or workload programs on an IC design model of a conventional test system.

FIG. 1 shows a conventional test system 100 that an IC designer may employ as a benchmarking tool for existing or new IC designs. Test system 100 includes a processor 110 that couples to a bus 120 to process information it receives via bus 120. A memory controller 130 couples a system memory 140 to bus 120. A video graphics controller 150 couples a display 155 to bus 120. System memory 140 includes simulation software 170 such as SPICE. IC designers may use SPICE or other simulation software to develop an analog and digital representation of the IC under development. System memory 140 includes such an IC design model 175. IC design model 175 represents a virtual model of the particular IC design under development, test, benchmarking, or other analysis. Designers may use simulation software 170 tools to develop IC design models for new designs or utilize previous IC design models from prior design development programs. IC design model 175 may be one output of simulation software 170.

Benchmark analysis of prior IC designs may be useful in estimating the design and performance characteristics of new designs. For example, designers may use the results of a simulation program to benchmark or estimate the performance of the design even prior to the implementation of the design in hardware. Due to the large amount of data associated with IC design development, performance evaluation tools typically provide sampling methodologies to reduce the total amount of data for evaluation. System memory 140 includes benchmark software 180 such as "Simulation Points" (SimPoint), an open source test program promoted at the ASPLOS 2002 and ISCA 2003 conferences. SimPoint employs one such sampling methodology, namely trace or instruction sampling.

System memory 140 also includes workload program software such as a workload program 185. Benchmark software 180, such as SimPoint, monitors the addresses of each instruction of workload program 185 during execution or simulation of IC design model 175. Other software simulation tools, such as "Self Monitoring Analysis and Reporting Technology" (SMART) tool and Turbo SMART, identify program phase behavior in workload program 185 using instruction or trace sampling techniques. SimPoint, SMART, and Turbo SMART are examples of open source benchmark software and, more particularly, tracer programs.

Test system 100 employs benchmark software 180 and executes a workload, such as workload program 185, on IC design model 175. Workload program 185 may include common industry standard test programs, such as SPEC2000, SPEC2006, and TPC-C, for example, for use by IC designers during development and evaluation of complex IC designs. Such standard test application software provides a baseline for comparison of benchmark performance results between broad types of IC design specifications. IC designers may use workload program software, such as SPEC2006, to provide an analysis of the performance characteristics of a particular IC design prior to the costly implementation of the IC design in hardware.

IC designers may compare the performance of one IC design to another. For example, IC designers may compare the performance of one generation of the PowerPC (PPC) processor IC to a next generation PPC processor IC design. Another useful aspect of benchmark analysis is using the benchmark process to provide input for IC design during IC design trade-offs. IC design trade-offs, such as physical footprint, power consumption, noise immunity and many other trade-offs, consume many hours of design and development time. Benchmark analysis allows IC designers to make changes to the IC design model and compare prior results to new results before finalizing decisions relating to small or large IC design hardware, software, or other modifications.

IC designers may also use real world customer user application software as workload program 185. In this manner, test system 100 may simulate a real world application wherein the IC design model executes actual user software application programs. This methodology provides IC designers and customers early access to performance characteristics versus performance expectations of future IC designs. In one example, benchmark software 180 executes workload program 185 and collects a grouping of instructions or traces and develops groupings that depict different workload software program phases, such as memory reads, memory writes, numerical processing, and other program phases.

Benchmark software 180 executes tracer programs such as SimPoint to develop a clock "Cycles Per Instruction" (CPI) analysis of workload program 185. The CPI analysis provides a baseline or control to compare modifications, such as in the IC design model 175, for future analysis. For example, it is common to develop a CPI analysis for a particular IC design model 175 when executing an extensive or lengthy workload program 185, such as SPEC2006. IC designers may then use this CPI analysis to compare to future benchmarking analysis of new IC designs. CPI analysis provides designers with information concerning how many clock cycles workload program 185 uses to complete a particular instruction. When the entire workload program 185 executes on IC design model 175, a lower CPI value indicates better performance of IC design model 175 during simulation than a higher CPI value. Lower CPI values indicate higher utilization of the components that form IC design model 175.

A CPI analysis collects CPI information during the entire execution of workload program 185 on IC design model 175. Although this process may take considerable time to complete, IC designers typically only execute this process once per existing IC design and workload program 185. One very useful aspect of the CPI analysis is in comparing current results with the results of future smaller and representative workload programs. For example, benchmark software 180 such as SimPoint, may generate a representative workload program 190 that exhibits a smaller size or number of lines of code (LOC). This offers the IC designers the opportunity to execute must faster benchmark analysis on IC designs, such as IC design model 175, without extensive time constraints.

In one example, an IC designer may execute the representative workload program 190 on the same IC design model 175 that executes the original workload program 185. Comparing the CPI analysis of the smaller representative workload program 190 with the CPI analysis of the much larger original workload program 185 may provide a good estimate of how close the smaller representative workload program 190 comes to approximating the much larger original workload program 185. A CPI error, namely the difference between CPI data from workload program 185 and CPI data from representative workload program 190, provides one type of rating of the representative strength or representativeness of representative workload program 190. This CPI error rating of representativeness offers a numerical definition with respect to how close the smaller representative workload program 190 comes in operating like the larger original workload program 185. If the CPI error or representativeness rating is low, then the representative workload program 190 closely approximates the performance of the original and larger workload program 185.

The IC designer may then use the representative workload program 190 on IC design model 175 and compare the benchmark software 180 results, namely benchmark performance analysis, to changes on IC design model 175. Using representative workload program 190 in this manner may cause IC design evaluation time to decrease considerably. The IC designer may speed up the IC design process or test more design changes or do both. CPI analysis provides another powerful feature, namely the identification of workload software program phases that may be useful to IC designers and others who analyze the performance of the IC design model under evaluation. Comparing the CPI analysis of one IC design model 175 to the CPI analysis of another IC design model 175 is helpful in IC design.

R-Metric (HPCA 1995), shows one method of measuring the representative strength or representativeness of one workload program 185 to another for benchmarking purposes of IC designs. For example, during execution of workload program 185, benchmark software 180 may monitor instruction execution representative metrics, such as branch prediction data, instruction execution context, and other representative metrics per any particular clock cycle. Moreover, during execution of workload program 185, patterns such as program phases of a particular workload program 185 may become identifiable to designers and software benchmarking tools.

Program phases of workload program 185 that execute within benchmark software 180 may include numerical computations, repetitive graphical operations, disk load/store operations, register read/write operations or other operations. Designers and other entities may look for patterns in the CPI analysis that may reflect areas of similar program operation. Program phase analysis is an important tool that benchmark software 180 and IC designers may employ to reduce overall application software program review by eliminating or reducing the amount of information in similar program phases.

Instructions of a typical workload software program such as workload program 185 may be machine level assembly language instructions such as load, add, move, multiply, or other instructions. Conventional test system 100 may encounter a trillion or more instructions during execution of workload program 185. Benchmark software 180 may organize the instructions of workload program 185 into basic blocks. Organizing the instructions of workload program 185 into such basic blocks allows benchmark software 180 to reduce the magnitude or total size of the application software instruction data and to ultimately generate representative workload program 190. In other words, benchmark software 180 operates on test application software or workload program 185 to generate a reduced representative workload program 190 that is a subset of, and thus smaller than, test application software 185.

Basic blocks represent unique instruction segments of the total instruction set that forms workload program 185. Basic blocks are segments or sections of program instructions from a larger test application software program, namely workload program 185, that start after a branch instruction and end with another branch instruction. A test application software program, such as workload program 185, may contain up to trillions or more lines of code (LOC). Compilers generate compiled LOC that execute on a particular hardware platform. Workload program 185 contains the compiled LOC for use on the IC design model 175 platform. Basic blocks may repeat multiple times within workload program 185 after a particular compiler compiles a software programmer's higher level program language.

Figure 2:
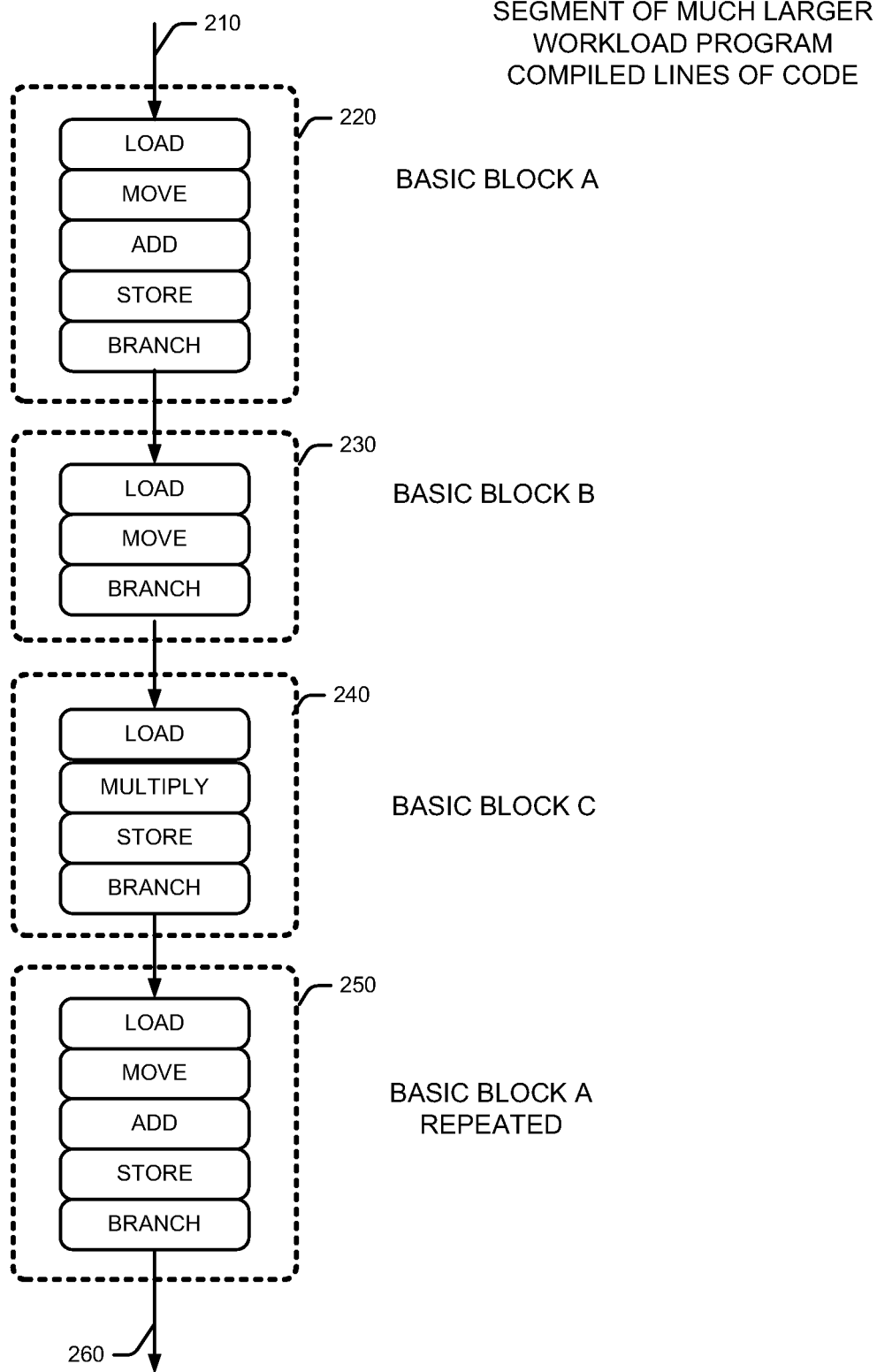
FIG. 2 depicts basic block identification from a particular segment of instructions of a larger test application workload program that executes on the test system of FIG. 1.

FIG. 2 depicts a software program instruction segment 200 of the much larger set of instructions or LOC of a workload or test application software program, such as workload program 185. The down arrow 210 at the top of the instruction segment 200 represents a connection from a previous branch instruction of the much larger set of instructions of workload program 185. The first instruction at the top of a basic block A 220 is an assembly language or machine language load instruction, namely LOAD. Basic block A 220 includes the LOAD, MOVE, ADD, STORE and BRANCH instruction at the top of instruction segment 200.

As shown in FIG. 2, each basic block is a grouping, collection, or set of individual instructions within a larger instruction sequence. Basic blocks begin after a previous branch instruction. A basic block B 230 of instruction segment 200, follows basic block A 220 of the same instruction segment 200. Basic block B 230 includes the instructions, LOAD, MOVE, and ends with a BRANCH instruction. A basic block C 240 follows basic block B 230 of instruction segment 200. Basic block C 240 includes the instructions, LOAD, MULTIPLY, STORE and BRANCH instruction.

Workload program 185 may include a large amount of identical basic blocks, as with many test application software programs. In the example of FIG. 2, one such identical basic block is a basic block A 250. Basic block A 250 is identical to basic block A 220. Basic block A 250 follows basic block C 240 in the instruction set of instruction segment 200 and includes a LOAD, MOVE, ADD, STORE, and BRANCH instruction in sequence. After basic block A 250, as the down arrow 260 at the bottom of instruction segment 200 indicates, instruction sequencing continues to the larger workload program 185 and further instruction segments and basic blocks not shown. Within workload program 185, basic block A 220 or other basic block may repeat due to software programmer input, compiler execution output, or other reason.

The repetition of basic block A 220, as shown by basic block A 250, may provide an opportunity for benchmark software 180 to reduce the total amount of instruction or trace calculations during the software simulation, benchmarking, or other analysis of IC design model 175. Repetition of multiple basic blocks in sequence may provide insight into repetitious execution program phases of test application sampling software 180, and opportunities for total instruction count reduction therein. As stated above, workload software programs are typically very large, often including more than a trillion individual instructions or LOC.

Basic blocks, such as the basic blocks of FIG. 2, provide input into one methodology to reduce the total amount of information, such as instruction counts, of test software for software simulation, benchmark, and performance tools. For example, since basic blocks repeat multiple times within a typical workload software program, benchmark software 180 may treat basic blocks as the primary unit of measure during execution of workload program 185 and further analysis of IC design model 175. In other words, benchmark software 180 may collect the execution count or number of times that basic blocks, such as basic block A 220, repeat during the execution of workload program 185 with IC design model 175.

From the collection of basic block execution counts, benchmark software 180 may generate a basic block vector (BBV) that includes basic block identifiers such as basic block A 220 and the number of times that particular basic blocks repeat during execution of workload program 185. A collection of basic blocks and the execution counts for those particular basic blocks together form a basic block vector (BBV). For example, each unique basic block that workload program 185 executes provides input into the formation of basic block vectors (BBVs). One known method for generating BBVs involves executing a workload software program, such as workload program 185, in a virtual environment that test system 100 with its IC design model 175 provides.

Workload program 185 exhibits a specific size or LOC count that describes the program size. More specifically, the compiled code of workload program 185 includes a start and a finish. Benchmark software 180 executes workload program 185 from start to finish. An IC designer or other entity tests the virtual design of an IC that IC design model 175 represents by executing benchmark software 180 with workload program 185 in test system 100 with IC design model 175 loaded.

Benchmark software 180 uses BBV analysis to reduce the total size of workload program 185 and thus generate the reduced representative workload program 190 therefrom. Representative workload program 190 is a subset of, and thus smaller than, workload program 185. Since representative workload program 190 is smaller than workload program 185, representative workload program 190 executes faster than workload program 185 in the virtual test environment of conventional test system 100. Benchmark software 180 may generate output data to demonstrate the design performance characteristics of the virtual IC design model 175 using the representative workload program 190. Designers may interpret the results of the benchmark software 180 to determine if design guidelines are met, or if redesign efforts in hardware, software, or other design areas are needed.

Benchmark software 180 executes workload program 185 on a virtual design model, namely IC design model 175, that test system 100 provides. Workload program 185 may be test software that exercises particular areas of IC design model 175. Workload program 185 may be user software that end-user customers plan on using on a real world product or production model of IC design model 175. In either case, the benchmark software 180 generates real world results corresponding to the instructions that execute therein.

In one example, the benchmark software 180 evaluates each 1 million instructions during execution of workload program 185 at a time until either the workload software program ends, or until the benchmark software reaches a particular BBV count. Each 1 million instructions represents one example of an instruction interval that designers may assign as the primary instruction count size to evaluate during execution of workload program 185. An instruction interval is a size in LOC and not a period of time of execution of workload program 185. Benchmark software 180 executes and evaluates the first instruction interval of 1 million instructions of workload program 185 and keeps track of each unique basic block that it encounters during execution. In one embodiment, test system 100 is a multi-processing system. In that case, the first 1 million instructions that benchmark software 180 executes may be in a different order than the original lines of code (LOC) of workload program 185.

FIG. 3 shows one example of a conventional BBV format 300 that benchmark software 180 may generate. A basic block vector BBV1 310 includes the results of the first instruction interval of 1 million instructions, namely instruction interval 1, that execute when workload program 185 executes on IC design model 175. Each cell of BBV1 310 in the top row of data includes a respective basic block identifier, namely basic block identifiers for basic block BB1-0 to BB1-63. Below each basic block identifier is the bottom row of data including the respective execution count or number of repetitions of each basic block when the workload program 185 executes on a simulator or test system 100. For example, BBV1 310 includes column 310-0 that describes basic block BB1-0 and its respective execution count of 380. In other words, in this example the first basic block of BBV1 310, namely BB1-0, executes 380 times within the first instruction interval of 1 million execution instructions of workload program 185.

The next unique basic block that the benchmark software 180 executes in the instruction interval 1 is basic block BB1-1 that executes 220 times during the first 1 million instructions of execution of workload program 185, as shown in column 310-1. Column 310-2 shows basic block BB1-2 and a respective execution count of 140, and so forth until basic block BB1-63 executes 280 times, as shown in column 310-63. In this example, benchmark software 180 identifies a total count of 64 unique basic blocks, namely BB1-0 310-0 through BB1-63 310-63. Basic block vector BBV1 310 is complete or full of data when the benchmark software 180 executes the entirety of instruction interval 1 or the first 1 million instructions of workload program 185.

Each entry in the data fields of the bottom row of BBV1 310 represents the number of executions of a respective basic block immediately above. The basic block vector (BBV) contains significantly less information than the 1 million instructions that benchmark software 180 uses to create the BBV. In this manner, the BBV offers a dramatic reduction opportunity in data for evaluation of workload program and hardware performance on a particular IC design model without dramatically reducing the significance or value of that data to the IC design benchmarking process.

Benchmark software 180 executes the next instruction interval, namely instruction interval 2 or second set of 1 million instructions of application software, to generate the next basic block vector, namely BBV2 320. Each cell of BBV2 320 in the top row of data includes a respective basic block identifier, namely basic block identifiers for basic blocks BB2-0 to BB2-63, of 64 basic blocks. Like BBV1 310, below each basic block identifier of BBV2 320 is a respective execution count or number of repetitions of the corresponding basic block. These execution counts or repetitions form the bottom row of data of basic block vector BBV2 320. BBV2 320 includes column 320-0 that shows basic block BB2-0 and a respective execution count of 180. In other words, in this example the first basic block that the benchmark software 180 encounters in the second set of 1 million instructions of workload program 185 is basic block BB2-0 that executes 180 times.

The next unique basic block that benchmark software 180 encounters is BB2-1 that executes 120 times during instruction interval 2 of application software execution, as shown in column 320-1. Column 320-2 shows basic block BB2-2 and an execution count of 340, and so forth until basic block BB2-63 executes 175 times as seen in column 320-63. Basic block vector BBV2 320 is complete or full of data when the benchmark software 180 executes the entirety of the second 1 million instructions, namely instruction interval 2, of workload program 185. Each entry in the data fields of the bottom row of basic block vector BBV2 320 represents the execution count of a particular basic block. In the case of BBV2 320, the total number of basic blocks remains the same as BBV1 310, namely 64 unique basic blocks. However, the basic block execution counts, as seen in the bottom row of each BBV, namely BBV1 310 through BBVN 330, differ because of the nonrepetitive nature of workload program instructions, such as workload program 185. Any particular 1 million workload program instructions are likely to have a unique set of total basic block execution counts.

As the benchmark software 180 generates BBVs, each BBV becomes a unique set of data representative of each 1 million instructions of workload program 185. These BBVs are useful for understanding application software flow, such as the flow of workload program 185. BBVs take on a data form that closely relates to the program phase that the workload program 185 executes during their formation. For example, BBV1 310 may represent a memory read/write operation and provides a higher level structure than the detailed instructions that constitute the input therefor. BBV1 310 includes much less data than the 1 million instructions that benchmark software 180 evaluates during construction of BBV1 310. By grouping similar BBVs, benchmark software 180 may further reduce the total amount of data that designers use to reduce the size workload program 185 and evaluate the performance of a particular IC design model.

Benchmark software 180 continues execution with the next set of 1 million instructions populating a BBV3, a BBV4, etc. (not shown), until finally generating a basic block vector BBVN 330, wherein N is the total number of basic block vectors in the workload program 185. In other words, BBVN 330 is the last in the series of BBVs that the benchmark software 180 generates during execution of workload program 185. BBN-0, BBN-1, BBN-2, and so on, including BBN-X, represent the basic blocks that the benchmark software 180 generates during the final 1 million count of instructions, namely instruction interval N, of the workload program 185. In this example, X is 63, and the total number of unique basic blocks in BBVN 330 is 64.

BBVN 330 populates in the same fashion as BBV1 310 and BBV2 320 as described above. BBVN 330 is the final or last BBV that benchmark software 180 generates because the workload program 185 completes or designers select a maximum BBV count. In one example, if workload program 185 includes 100 million LOC and each instruction interval or BBV exhibits 1 million instructions, then workload program 185 exhibits in 100 BBVs. In other words, the final BBVN corresponds to a value of 100 for N or 100 BBVs. Typical workload programs, such as workload program 185, may generate hundreds or more BBVs. The BBV count may vary due to the workload program size, sampling interval size, BBV format, and other parameters. Although the example of FIG. 3 utilizes a BBV instruction interval of 1 million instructions and a BBV basic block count of 64, benchmark software 180, simulation tools, designers, and other entities may select other values for these parameters.

As described above, BBVs are a representative sample of the workload program 185 that executes on a virtual IC design model. Benchmark software 180 executes a clustering tool program such as SimPoint or other clustering tool that may use the BBV data to establish clusters of similar BBVs, and thus clusters or cluster groups of similar instruction intervals. Benchmark software 180 or other sampling tool software may choose the most representative instruction interval in a cluster group to represent the entire cluster group. Such conventional benchmark and sampling tool software offers a reduction in overall data for other software tools to use in the aid of IC design development, and provides for much faster IC design analysis than other detailed transistor and component level simulation.

One limitation of conventional benchmark software 180, such as SimPoint software, and BBV generation as shown above in FIG. 3, is that conventional benchmark software captures the "program phase" changes due to changes in program control flow. A program phase represents a particular sequence of basic blocks relating to hardware and software operation. Conventional benchmark software 180 may not capture program phase changes that occur as the result of changes in IC design model microarchitecture dependent events. Microarchitecture dependent events include any CPI delays due to an interaction of workload program 185 with any particular hardware unit or structure of IC design model 175. Microarchitecture hardware units may include data caches, data effective to real address translation units (DERATs), branch misprediction units, fixed point processor units (FXUs), instruction cache units, and other hardware unit structures.

Microarchitecture hardware units include any hardware mechanism, functional unit, or other device of IC design model 175 that interfaces or interacts with the execution of workload program 185. Microarchitecture dependent delays may include DERAT misses, branch mispredictions, data and instruction cache misses, and other factors that may cause an increase in CPI and an increase in CPI data during execution of benchmark software 180. Microarchitecture dependencies, such as memory behavior, or more particularly cache miss rates, may be lost in the conventional format described above in BBV format 300 of FIG. 3 and the subsequent performance analysis by benchmark software 180.

Figure 4:
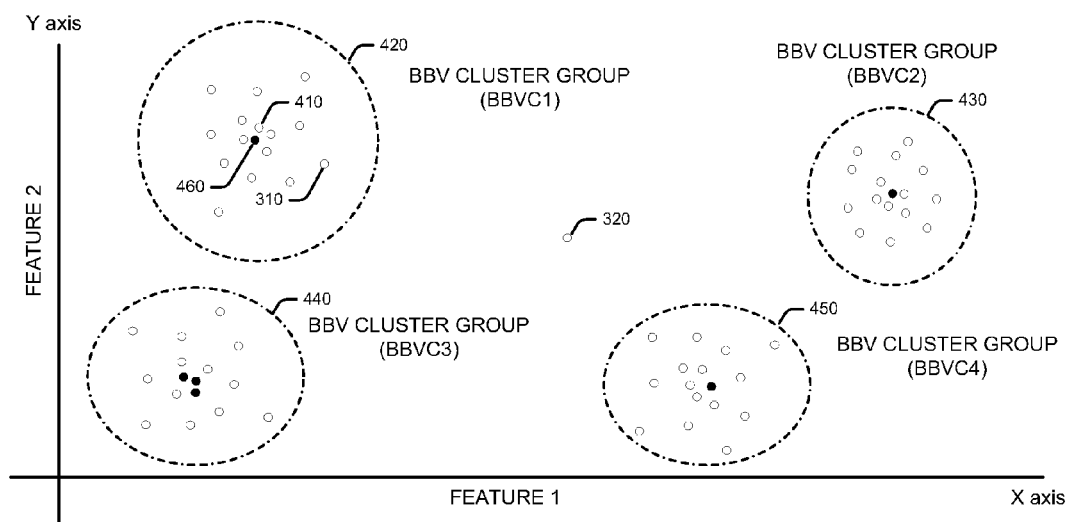
FIG. 4 is a cluster map diagram depicting cluster data points and cluster groups from the mapping of basic block vectors of workload program software that executes on an IC design model.

FIG. 4 shows a cluster map diagram 400 that depicts a method of grouping or clustering basic block vectors (BBVs). Cluster map diagram 400 is a visual representation of one method that benchmark software 180 may employ to cluster or group instruction interval data, such as BBVs, during execution and analysis of workload program 185. Each cluster data point, as seen by a small circle such as circle 410 on the cluster map diagram, denotes one BBV of the collection of vectors that benchmark software 180 may generate during the execution and analysis of workload program 185. Stated alternatively, each cluster data point, such as circle 410 represents one instruction interval, such as 1 million instructions that benchmark software 180 executes and analyzes.

Each vector, such as the BBVs described in FIG. 3 above, corresponds to one sampling instruction interval, such as 1 million instructions, of the total trace and basic block analysis of IC design model 175. For example, in FIG. 4 BBV1 310 may represent one unique cluster data point on cluster map diagram 400. In this example, a cluster group, such as BBV cluster BBVC1 420 contains a grouping of BBVs. By proper selection of the X axis and Y axis parameters, BBVs may group or cluster together in relationships that directly link to program phases that occur during the execution of workload program 185. BBV2 320 of FIG. 3 shows one BBV that falls outside of any particular cluster group. This may occur because a particular basic block vector, such as BBV2 320, may be part of workload program 185 operation that does not repeat, or group to a particular program phase. In one example, BBV2 320 may correspond to a particular operation of workload program 185, such as initializing register values of IC design model 175 during power-up of test system 100. In this case, BBV2 320 does not fall within any particular cluster group and benchmark software 180 will not use the data of BBV2 320 for further benchmarking analysis of IC design model 175.

As seen in the example of FIG. 4, multiple cluster groups may form during the execution of workload program 185. For example, cluster group BBVC2 430 may represent another of multiple cluster groups, such as the BBV cluster groups. BBVC3 440 and BBVC4 450 form from the execution and analysis of workload program 185. Other BBV cluster groups, not shown, may form to create multiple cluster groupings that further represent multiple program phases of the operation of workload program 185 on IC design model 175. The total number of cluster groups, may depend on the length or size of workload program 185, user input, as well as other factors.

In FIG. 4 feature 1 and feature 2 respectively represent the X and Y axis parameters of the cluster map diagram 400 that benchmark software 180 may generate. The feature 1 and feature 2 parameters provide feature selection or sorting of BBVs by workload characterization graphing. Workload characterization graphing provides a method of performance modeling by program phase of IC design model 175 while executing workload program 185. One such workload characterization method is the K-Means clustering analysis method, developed at the University of Berkeley, utilizing Manhattan Distance cluster data point calculations. Manhattan Distance measurement provides for analysis of cluster data points by calculating the sum of the absolute difference of each of their coordinates from one another. In other words, the distance between two cluster data points is the sum of the orthogonal coordinate distance between the points.

K-Means clustering provides one method of grouping or partitioning a large data set into subsets or clusters such that the data in each subset share a common set of traits. K-Means clustering may provide this method for grouping the BBV results of the execution of workload program 185 by benchmark software 180. For example, BBV cluster group BBVC1 420 is a grouping of particular BBVs that may represent the operational program phase for processing a graphical object transformation on a graphics display, such as display 155. In this example, the common trait is graphical object processing instructions or basic block and basic block execution counts of those particular BBVs. A cluster group BBVC2 430 may represent a cluster or group of different particular BBVs that corresponds to instructions that further execute read and write operations to memory, such as system memory 140. In this example, the common trait is "read and write" instructions or basic block and execution counts of the different particular BBVs.

The cluster map diagram 400 of BBVs presents opportunities to reduce the overall benchmarking complexity by reducing the total amount of data that benchmark software 180 analyzes after execution of workload program 185. For example, benchmark software 180 may reduce BBV cluster group BBVC1 420, that corresponds to a program phase, to a single representative BBV. This single representative BBV corresponds to one instruction interval, namely 1 million instructions of workload program 185 in this particular example. One method to reduce the overall complexity or size of the workload program 185 is to have the benchmark software 180 calculate the centroid or center of each cluster and choose the BBV that is closest to the centroid or center. The dark circle, or cluster data point nearest the centroid or center of cluster group BBVC1 420 is the particular BBV, namely BBV 460, that most closely fits the parameters of all of the BBVs of that cluster group collectively.

Another technique that benchmark software 180 may use to reduce each cluster group in size is to choose a BBV count and select that count or number of BBVs nearest the centroid of a cluster. For example, benchmark software 180 chooses a BBV count of 3, and the three dark points at the center of cluster group BBVC3 440 are BBVs that benchmark software 180 selects as representative BBVs. To weight each cluster group properly, benchmark software 180 may select a representative number of BBVs closest to the center of a particular cluster group, such as cluster group BBVC1 420 that correspond to the total number or weight of instruction intervals that particular BBV cluster group contains. In this manner, benchmark software 180 more properly weights each cluster group of cluster map diagram 400 equally. Many other weighting schemes are possible as well. Designers may select these methodologies by determining the best trade-off among simulation time, raw data for input, number crunching capability of the test system, and other factors.

One method that benchmark software generates representative workload program 190 is by use of the BBV cluster group centroid analysis. For example, designers may assign an overall budget or total instruction size to representative workload program 190. In one example, designers assign a total budget size of 10 million instructions to representative workload program 190. In other words, reduced and representative workload program 190 will contain a total of 10 million instructions that best matches or represents workload program 185. Workload program 185 generates BBV cluster groups, such as those of FIG. 4 by running tracer and other benchmarking program. In one example a total of 10 BBV cluster groups form from the analysis of workload program 185.

Workload program 185 selects the centroid or BBV closest to the center of each BBV cluster group. By combining the 1 million instruction size instruction intervals of each BBV centroid, benchmark software 180 generates a 10 million instruction set. In this method, benchmark software 180 generates representative workload program 190. Representative workload program 190, with 10 million instructions in length, provides a dramatic reduction in overall instruction size from workload program 185 which exhibits a size of 100 million instructions, in this particular example. Designers may use representative workload program 190 for further testing of IC designs. However, the particular method described above does not take microarchitecture dependent information into account during the generation of reduced representative workload program 190.

Figure 5:
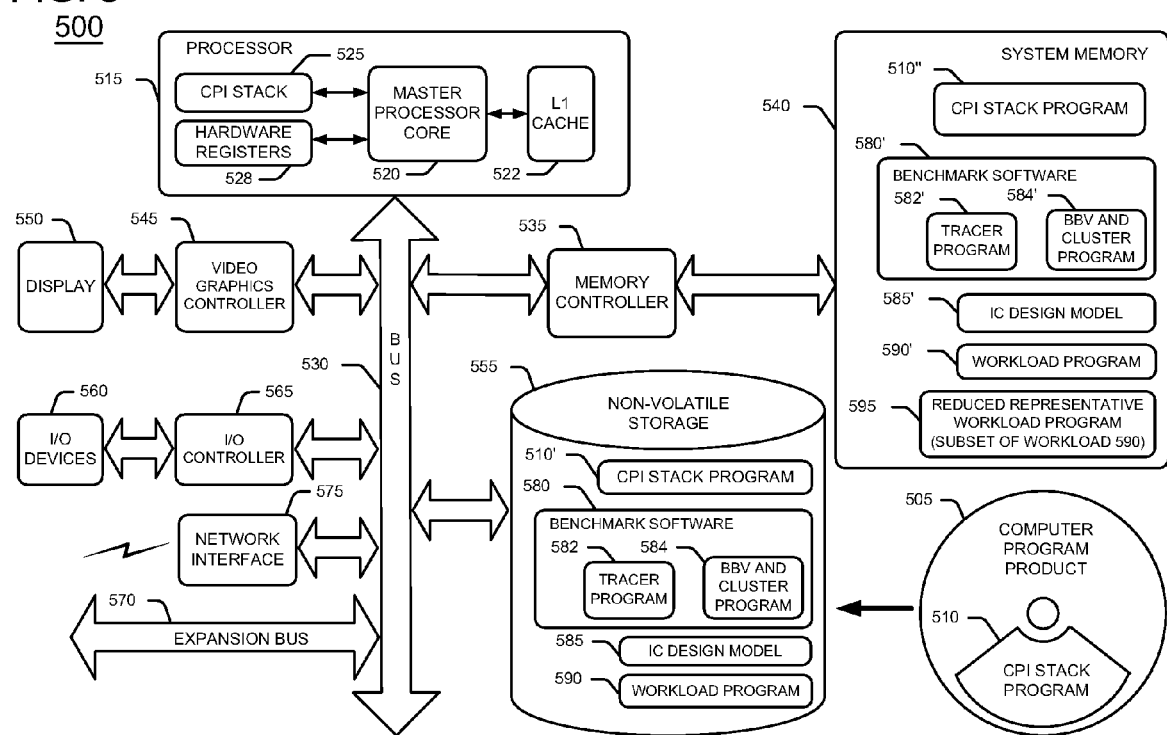
FIG. 5 is a block diagram of one embodiment of the disclosed test system that executes CPI stack program software with workload program software on an IC design model.

FIG. 5 shows one embodiment of the disclosed simulator test system 500 that IC designers and testers may employ as an IC design simulation and benchmarking tool. Understanding the effect of microarchitecture dependent information and the inclusion of microarchitecture dependent information in the benchmarking process is significant to the disclosed methodology. Simulator test system 500 includes a computer program product 505, such as a media disk, media drive or other media storage. Simulator test system 500 also includes a CPI stack program 510 that enables IC designers to perform benchmarking of IC designs at any time during the IC development process. CPI stack program 510 includes CPI generation and analysis software. In contrast with other test systems that simply employ BBV generation and analysis, one embodiment of the disclosed test system 500 employs fine grain and course grain sampling of data that includes microarchitecture dependent information and CPI data as explained in more detail below.

Test system 500 includes a processor 515 that includes a master processor core 520. Master processor core 520 couples to an L1 cache 522. Processor 515 includes a cycles per instruction (CPI) stack 525 and hardware registers 528 that each couple to master processor core 520. In one embodiment, CPI stack 525 and the hardware registers 528 may be general purpose registers, counters, or other memory devices of processor 515 for use by master processor core 520. Processor 515 couples to a bus 530. A memory controller 535 couples a system memory 540 to bus 530. A video graphics controller 545 couples a display 550 to bus 530. Test system 500 includes a nonvolatile storage 555, such as a hard disk drive, CD drive, DVD drive, or other nonvolatile storage that couples to bus 530 to provide test system 500 with permanent storage of information. System memory 540 and nonvolatile storage 555 are each a form of data store. I/O devices 560, such as a keyboard and a mouse pointing device, couple via an I/O controller 565 to bus 530.

One or more expansion busses 570, such as USB, IEEE 1394 bus, ATA, SATA, PCI, PCIE and other busses, couple to bus 530 to facilitate the connection of peripherals and devices to test system 500. A network interface 575 couples to bus 530 to enable test system 500 to connect by wire or wirelessly to other network devices. Test system 500 operates as a simulator, elements of which are virtual and elements of which are real. Test system 500 may take many forms. For example, test system 500 may take the form of a desktop, server, portable, laptop, notebook, or other form factor computer or data processing system. Test system 500 may also take other form factors such as a personal digital assistant (PDA), a gaming device, a portable telephone device, a communication device or other devices that include a processor and memory.

Test system 500 may employ a compact disk (CD), digital versatile disk (DVD), floppy disk, external hard disk or virtually any other digital storage medium as medium 505. Medium 505 stores software including CPI stack program 510 thereon. A user or other entity installs software such as CPI stack program 510 on test system 500 prior to conducting testing with CPI stack program 510. The designation, CPI stack program 510', describes CPI stack program 510 after installation in non-volatile storage 555 of test system 500. The designation, CPI stack program 510", describes CPI stack program 510 after test system 500 loads the CPI stack program 510 into system memory 540 for execution.

Benchmark software 580 includes simulation and performance software programs, such as a tracer program 582, and a BBV and cluster program 584, and may include other benchmark programs as well. Examples of tracer programs include, but are not limited to, the "C Library Trace Program" (CTrace), the "Maryland Applications for Measurement and Benchmarking of I/O On Parallel Computers" tracer program (Mambo), and the AriaPoint tracer program by Aria Technologies. BBV and cluster programs are software programs, such as SimPoint or SMART, that test system 500 employs to provide instruction basic block analysis, BBV generation and BBV clustering as well as other analysis.

Test system 500 includes an IC design model 585. IC design model 585 is a database of components, timing information, parameters and specifications of a virtual IC that CPI stack program 510 employs as described below. A workload program 590 is a benchmark program such as SPEC2000, SPEC2006, TPC-C, or other test program for use by test system 500 and IC designers during development and evaluation of complex IC designs. Workload program 590 is a program or set of instructions that CPI stack program 510 employs to simulate the execution of software program instructions or other workload programs on IC model 585.

Tracer program 582 may trace or otherwise analyze instruction addresses of workload program 590 during execution of workload program 590 on IC design model 585. CPI stack program 510 may generate a CPI database for each instruction of workload program 590 execution. CPI stack program 510 may monitor and store microarchitecture dependent information, such as instruction address misprediction information, CPI information, L1 cache 521 misses, or other information during execution of workload program 590 on IC design model 585. This microarchitecture dependent information may be useful in the generation of a reduced workload program, such as a reduced representative workload program 595.

CPI stack program 510 may evaluate functional units such as microarchitecture hardware units of the IC design model 585 during execution of workload program 590. Examples of microarchitecture hardware units of the IC design model 585 (such as a complete PowerPC processor) evaluation may include caches, flush mechanisms, DERAT reject mechanisms, branch misprediction units, or other IC design functional units. Each of these functional devices or units form part of the IC design model 585 simulation model of a particular IC design. The particular IC design may be under consideration for production or may already exist in hardware and require testing for performance modeling such as benchmarking.

CPI stack program 510 is a software simulation and benchmarking tool. Test system 500 executes CPI stack program 510 to evaluate IC design characteristics of IC design model 585 for performance and other analysis. Test system 500 employs benchmark software 580 to provide instruction trace and other performance evaluation of workload program 590 that executes on IC design model 585. Benchmark software 580 loads on non-volatile storage 555 from another test system or other entity prior to evaluation of IC design model 585. Benchmark software 580 includes tracer program 582 and BBV and cluster program 584. The designation, benchmark software 580', that includes tracer program 582' and BBV and cluster program 584', describes the benchmark program 580 after test system 500 loads the benchmark program 580 software into system memory 540 for execution.

IC design model 585 loads on non-volatile storage 555 from another test system or other entity prior to execution of CPI stack program 510. In a similar fashion, workload program 590 loads on non-volatile storage 555 from another test system or other entity prior to execution of CPI stack program 510. The designation, IC design model 585', describes the IC design model 585 after test system 500 loads the IC design model 585 and CPI stack program 510 into system memory 540 for execution. Similarly, the designation, workload program 590', describes the workload program 590 after test system 500 loads the workload program 590 into system memory 540 for execution on the IC design model 585'.

CPI stack program 510 generates a representative workload, such as reduced representative workload 595 during execution and evaluation of IC design model 585. In one example of the disclosed methodology, CPI stack program 510 reduces the total LOC count of workload program 590 into a smaller representative version of that workload program, namely reduced representative workload 595. In other words, reduced representative workload 595 is a representative subset of workload program 590. System memory 540 may store the reduced representative workload 595 for execution within test system 500. CPI stack program 510" evaluates the performance characteristics of reduced representative workload 595 on an IC design model such as IC design model 585.

In one embodiment, CPI stack program 510 implements the disclosed methodology as a set of instructions (program code) in a code module which may, for example, reside in the system memory 540 of test system 500 of FIG. 5. Until test system 500 requires this set of instructions, another memory, for example, non-volatile storage 555 such as a hard disk drive, or a removable memory such as an optical disk or floppy disk, may store this set of instructions. Test system 500 may also download this set of instructions via the Internet or other computer network. Thus, a computer program product may implement the disclosed methodology for use in a computer such as test system 500. In such a software embodiment, RAM or system memory 540 may store code that carries out the functions described in the flowchart of FIG. 7 while processor 515 executes such code. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

Figure 6:
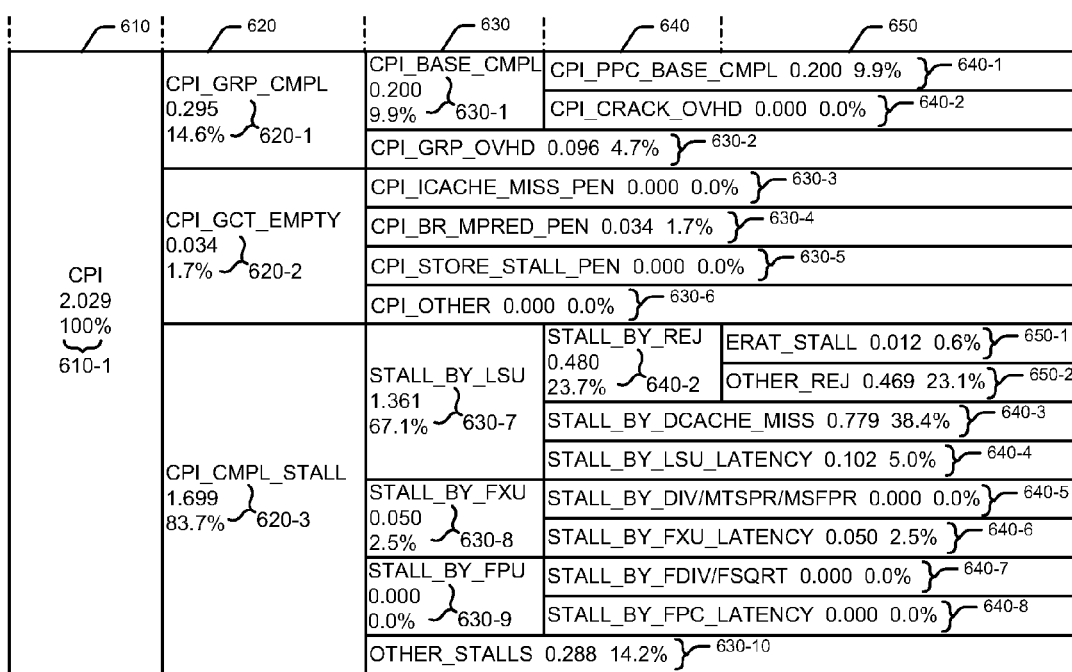
FIG. 6 is a representation of CPI stack information that CPI stack program software generates by executing workload program software on an IC design model.

FIG. 6 depicts a CPI stack diagram 600 that further demonstrates the CPI analysis of IC design model 585 within test system 500 and the execution of workload program 590. During analysis of IC design model 585, test system 500 evaluates on a per instruction basis the CPI data of workload program 590. In other words, CPI stack program 510 keeps track of how many clock cycles it takes to complete each instruction of the instructions of workload program 590. CPI stack program 510 also keeps track of microarchitecture dependent information that hardware registers 528 store during execution of workload program 590. In one embodiment, test system 500 maintains CPI data in CPI stack 525 and compiles a total CPI analysis upon completion of the workload program 590. One example of CPI stack 525 data is shown in the CPI stack diagram of FIG. 6.

CPI stack diagram 600 depicts the results of one example workload program 590 execution on IC design model 585, such as a PowerPC (PPC) or other IC design. In this particular example, column 610 shows the total CPI as a value of 2.029 clock cycles that represents 100% of the total CPI data analysis of workload program 590. In other words, this example demonstrates that the average instruction of workload program 590 takes 2.029 clock cycles to complete. CPI 610-1 thus represents the cycles per instruction (CPI) for an average instruction of workload program 590. The total CPI 610-1 analysis may include CPI analysis of hardware elements, functional units, firmware, and other devices (not shown) of IC design model 585. To the right of column 610 is a breakdown in increasing detail of the CPI data that forms the total CPI value of 2.029 or 100% of the total CPI data. Each box of CPI stack diagram 600 corresponds to CPI data for a respective hardware element, functional unit, or other structure of IC design model 585. The label of each box of CPI stack diagram 600 indicates the specific portion of IC design model 585 that is responsible for the data in that box.

In other words, each box in CPI stack diagram 600 depicts a CPI category and a corresponding CPI data value and CPI data percentage value. Each box in CPI stack diagram 600 also represents a functional unit or microarchitecture unit of IC design model 585. In one embodiment of the disclosed method, column 620 shows three major categories of CPI data. In the top box of column 620, a CPI_GRP_CMPL 620-1 category data value of 0.295 and data percentage of 14.6%, represents 14.6% of all CPI data of CPI 610-1. The CPI_GRP_CMPL 620-1 category is the CPI group completion set of data for the instructions of workload program 590. This CPI group completion data shows clock cycles in which a particular instruction of workload program 590 completes. This is useful information for a designer because instruction completion is a positive result of workload program 590 operation.

To the right of column 620, the top box in column 630 shows a CPI_BASE_CMPL 630-1 category data value of 0.200 and data percentage of 9.9%. CPI_BASE_CMPL 630-1 is the CPI base completion data value portion of the CPI_GRP_CMPL 620-1 data value of 14.6%. In the second box from the top in column 630, the CPI_GRP_OVHD 630-2 category contains the CPI grouping overhead data value of 0.096 and 4.7% of the total CPI_GRP_CMPL 620-1 category. Combining CPI_BASE_CMPL 630-1 of 9.9% and CPI_GRP_OVHD 630-2 of 4.7% yields a result of 14.6% that matches the CPI_GRP_CMPL 620-1 data value percentage of 14.6%.

Since the box for the CPI_GRP_OVHD 630-2 spans across other columns to the right of column 630, namely columns 640 and 650, this demonstrates that there are no further breakdowns or details forming that particular data value. The first and second boxes from the top in column 640 reflect more detail to CPI_BASE_CMPL 630-1, namely CPI_PPC_BASE_CMPL 640-1 and CPI_CRACK_OVHD 640-2. CPI_PPC_BASE_CMPL 640-1 represents a CPI PPC base completion cycle that exhibits a data value of 0.200 and a percentage of 9.9%. CPI_CRACK_OVHD 640-2 CPI corresponds to cracking overhead and exhibits a data value of 0.000 and a corresponding percentage 0.0%. A particular instruction of workload program 590 may require more than one internal operation of the resources of simulator test system 500. In one embodiment, simulator test system 500 performs cracking operations when executing a particular instruction of workload program 590 that requires exactly two operations within simulator test system 500. "Cracking overhead" corresponds to the overhead or resources of simulator test system 500 when executing cracking operations. In contrast, simulator test system 500 performs microcode operations when executing a particular instruction of workload program 590 that requires more than two operations within simulator test system 500. "Microcode overhead" corresponds to the overhead or resources of simulator test system 500 when executing microcode operations. Since CPI_CRACK_OVHD 640-2 does not contribute any measurable CPI data, CPI_PPC_BASE_CMPL 640-1 is effectively the entire data value component for CPI_BASE_CMPL 630-1 within the degree of measurability demonstrated in this example.

The second box from the top in column 620 depicts the CPI_GCT_EMPTY 620-2 category and includes a CPI GCT (Group Completion Table) Empty data value of 0.034 and a data value percentage of 1.7% of the total CPI 610-1 data. Simulator test system 500 may employ a Group Completion Table (GCT), not shown, to track instruction groups of workload program 590 that are currently executing or are in the current instruction pipeline of simulator test system 500. "GCT Empty" corresponds to instruction cycle counts wherein the instruction pipeline of simulator test system 500 starves or waits for more instructions. CPI stack program 510 generates data for CPI_GCT_EMPTY 620-1 by dividing "GCT Empty" instruction clock cycle counts by the total instruction execution completion clock cycle counts of workload program 590. Four category boxes, namely CPI_I-CACHE_MISS_PEN 630-3, CPI_BR_MPRED_PEN 630-4, CPI_STORE STALL_PEN 630-5, and CPI_OTHER 630-6 form the totality of CPI_GCT_EMPTY 620-2 data. CPI_I-CACHE_MISS_PEN 630-3 shows a CPI instruction cache miss penalty data value of 0.000 and data percentage of 0.0%. CPI_BR_MPRED_PEN 630-4 shows a CPI branch mispredict penalty data value of 0.034 and data percentage of 1.7%. CPI_STORE STALL_PEN 630-5 depicts a CPI store stall penalty data value of 0.000 and data percentage of 0.0%. Finally, in this group, the CPI_OTHER 630-6 shows CPI other data, such as an instruction flush, or other instruction data value of 0.000 and data percentage of 0.0%.

The third and final CPI category box from the top in column 620 depicts the CPI_CMPL_STALL 620-3 category, namely a CPI completion stall data value of 1.699 and data percentage of 83.7%. The CPI_CMPL_STALL 620-3 category is the largest component or cause of CPI data in the CPI stack diagram 600. In other words, CPI_CMPL_STALL 620-3 forms 83.7% of all of the CPI data of CPI 610-1, wherein CPI-610-1 represents the instruction analysis of workload program 590 as workload program 590 undergoes execution. STALL_BY_LSU 630-7, the CPI data from stalls due to a load and store unit (not shown) of IC design model 585, exhibits a data value of 1.361 and data percentage of 67.1% of the total CPI data of CPI 610-1. Designers may investigate this data and determine that 67.1% of all CPI delay originates in the load store unit, a microarchitecture unit of IC design model 585. The fact that this is such a large portion of the total CPI data of CPI 610-1 provides useful guidance to a designer who may further investigate CPI data error causes.

STALL_BY_REJ 640-2, namely the CPI data from stall by rejection of IC design model 585 exhibits a data value of 0.480 and corresponding data percentage of 23.7%. STALL_BY_DCACHE_MISS 640-3, namely the CPI data for stalls by data cache misses, exhibits a data value of 0.779 and data percentage of 38.4%. These stalls may be a cause of delays from data caches such as those of L1 cache 522 of test system 500. STALL_BY_LSU_LATENCY 640-4, namely the CPI data for latency stalls by the load and store unit (not shown) of IC design model 585, exhibits a data value of 0.102 and accounts for 5.0% of the total CPI 610-1 data. The summation of the CPI data of the STALL_BY_REJ 640-2 category, the STALL_BY_DCACHE_MISS 640-3 category and the STALL_BY_LSU_LATENCY 640-4 category account for the total CPI data of STALL_BY_LSU 630-7.

The STALL_BY_REJ 640-2 CPI category includes two components or categories in column 650, namely ERAT_STALL 650-1 and OTHER_REJ 650-2. Effective to real address translation entry ERAT_STALL 650-1 exhibits a data value of 0.012 and corresponding data percentage of 0.6%. Other rejections per OTHER_REJ 650-2 exhibit a data value of 0.469 and data percentage of 23.1%. Combining the results of the data values of ERAT_STALL 650-1 and OTHER_REJ 650-2 provides the data value for the table entry for CPI stack diagram 600 for the STALL_BY_REJ 640-2 category. The STALL_BY_FXU 630-8 category, namely the CPI stalls data due to a fixed point unit (not shown) of IC design model 585, includes a data value of 0.050 and a corresponding data percentage of 2.5%. The STALL_BY_FPU 630-9 category, namely the CPI stalls data due to floating point unit of IC design model 585, includes a data value of 0.000 and corresponding data percentage of 0.0%. The OTHER_STALLS 630-10 category represents any other stalls of IC design model 585 during execution of workload program 590 by CPI stack program 510 on test system 500. In this particular example, the OTHER_STALLS 630-10 category exhibits a data value of 0.288 that accounts for 14.2% of the total CPI 610-1 CPI data.

The STALL_BY_FXU 630-8 category of the CPI stack diagram of FIG. 6 includes both STALL_BY_DIV/MTSPR/MSFPR 640-5 and STALL_BY_FXU_LATENCY 640-6 CPI category data results. The STALL_BY_DIV/MTSPR/MSFPR 640-5 category, namely the result of stalls by a division unit (DIV) (not shown), relates to moves to special purpose registers (MTSPRs) or moves to a floating point register (MSFPR), and exhibits a data value of 0.000 and data percentage of 0.0%. The STALL_BY_FXU_LATENCY 640-6 category, namely the result of stalls due to fixed point unit latency, exhibits a data value of 0.050 and corresponding CPI data percentage of 2.5%. The STALL_BY_FPU 630-9 category includes both STALL_BY_FDIV/FSQRT 640-7 and STALL_BY_FPC_LATENCY 640-8 CPI data results. The STALL_BY_FDIV/FSQRT 640-7 category, namely the result of stalls by floating point divide unit (FDIV) (not shown) and floating point square root unit (FSQRT) (not shown), exhibit a data value of 0.000 and data percentage of 0.0%. The STALL_BY_FPC_LATENCY 640-8 category, namely the result of stalls due to floating point control (FPC) unit (not shown) exhibits a data value of 0.000 and a corresponding CPI data percentage of 0.0%.

The data shown in CPI stack diagram 600 provides designers, testers and other entities with valuable information regarding causes of CPI data from microarchitecture hardware units during evaluation of complex IC designs, such as IC design model 585. For example, the CPI stack diagram 600 informs a designer that stalls due to data cache misses, as seen in the STALL_BY_DCACHE_MISS 640-3 category, account for 38.4% of all CPI data. An effort by designers to reduce data cache misses may result in significant reduction opportunities in the overall CPI results for IC design model 585. CPI data, such as the information of CPI stack diagram 600, is unique to each workload program 590 and to each IC design model 585. Designers and others may test different workload program and various IC designs and obtain different CPI results, such as those of CPI stack diagram 600. The selection of instruction intervals to best reflect the high percentage areas of CPI stack diagram 600 helps to ensure that the reduced representative workload 595 will test areas of greatest CPI concern. However, the selection of instruction intervals for reduced representative workload 595 should generally closely represent the overall CPI analysis of workload program 590.

Significant factors for characterizing a trace may be CPI microarchitecture dependent information, such as branch miss-prediction rate, L1 cache miss rate, DERAT miss rate, instruction cache miss rate, and other CPI microarchitecture dependent information. Hardware counters such as hardware registers 528 may store CPI data for 1 million instructions during one interval and maintain this CPI data for each interval for analysis. CPI stack program software 510 may calculate the CPI error or difference between the CPI data value of that particular instruction interval versus the whole workload program 590 CPI data error as shown in FIG. 6. CPI stack program uses CPI microarchitecture dependent error information that hardware registers 528 and CPI stack 525 accumulate to populate the CPI analysis information, such as shown in CPI stack diagram 600.

Designers and other entities may use the results such as shown in CPI stack diagram 600 as a reference to compare the representative strength or representativeness of any reduced workload such as reduced representative workload 595. For example, designers and other entities may compare the results of CPI stack program 510" for workload program 590 to the CPI stack program 510" results of reduced representative workload 595. If the CPI data is very similar for the larger workload program 590 and the smaller reduced representative workload 595, then reduced representative workload 595 is similar or an effective replacement for workload program 590. Designers and other entities may use reduced representative workload 595 during extensive evaluation of IC designs, such as IC design model 585. CPI stack diagram 600 represents one example of a CPI analysis for a particular IC design model 585 with the execution of one particular workload program 590. Any changes to workload program software 590 or the IC design model 585 will result in different CPI error data and CPI stack data in CPI stack diagram 600.

FIG. 7 is a flowchart that depicts the steps of a reduced representative workload program 595 generation method that employs CPI stack program 510 to analyze CPI stack 525 microarchitecture dependent information. In one embodiment, the method employs workload program 590 as input and generates reduced representative workload program 595 as output. The method of FIG. 7 includes workload program 590 analysis by program tools in benchmarking software 580, such as tracer program 582 and BBV and cluster program 584. The method also includes workload program 590 analysis by CPI stack program 510 on IC design model 585. The disclosed representative workload generation method begins at start block 705. Tracer program 582 generates an instruction trace of workload program 590 while workload program 590 executes on IC design model 585, as per block 710. Tracer program 582 executes workload program 590 and generates instruction address traces and basic block execution count data.

Tracer programs such as tracer program 582 provide information that identifies the instruction address of the first instruction of each basic block and the number of instructions in each basic block. Tracer programs may provide count information that specifies how many times the workload program 590 executes each basic block. In other words, tracer programs within CPI stack program 510 provide analysis of workload program 590, wherein that analysis provides input for the generation of BBVs.

BBV and cluster program 584 evaluates the basic block data from tracer program 582 output and in response generates basic block vectors (BBVs) that correspond to each instruction interval of workload program 590, as per block 715. Each BBV, such as the BBVs of FIG. 3, corresponds to an instruction interval of 1 million instructions of workload program 580 that executes on IC design model 585 in test system 500. In one embodiment, the compiled code of workload program 590 is 100 million instructions in total length. In that case, BBV and cluster program 584 generates 100 BBVs that respectively correspond to 100 instruction intervals that each exhibit an instruction size of 1 million instructions.

BBV and cluster program 584 generates BBV cluster groups, such as BBV cluster groups BBVC1 420, BBVC2 430, BBVC3 440, BBVC4 450 and other cluster groups not shown in FIG. 4, as per block 720. Each cluster group represents a unique program phase of workload program 590. During the execution of benchmark software 580, namely tracer program 582 and BBV and cluster program 584, on IC design model 585, test system 500 may perform other analysis of workload program 590. For example, CPI stack program 510 may generate fine grain and coarse grain microarchitecture dependent data in parallel with benchmark software 580 or other software programs. Fine grain data refers to microarchitecture dependent error information that CPI stack program 510 analyzes and accumulates at periodic intervals during execution of workload program 590, for example during a particular instruction interval of workload program 590. In one embodiment, coarse grain data refers to an accumulation of microarchitecture dependent information over the entire length of workload program 590, namely for all instruction intervals of workload program 590.

During execution of workload program 590, hardware registers 528 collect microarchitecture dependent error information "on the fly", namely in real time while executing workload program instructions. CPI stack program 510 forms a fine grain collection of microarchitecture dependent error information by interrogating the hardware registers 528 for each instruction interval of workload program 590, as per block 730. Sampling instruction interval size selection reflects the designer's desired performance resolution or detail, as well as the total allowable IC design performance modeling time available. Any memory location of test system 500 may store the fine grain microarchitecture dependent information. For example, system memory 540 may store the fine grain microarchitecture dependent information.

During execution of each instruction interval of workload program 590, hardware registers 528 collect and store microarchitecture dependent error information "on the fly" or in real time for use by test system 500. From this microarchitecture dependent error information, CPI stack program 510 determines respective error rates for different types of microarchitecture dependent errors in a particular instruction interval, as per block 735. More particularly, for a particular instruction interval, CPI stack program 510 may determine a respective error rate value for each microarchitecture dependent error type. Examples of microarchitecture dependent errors types include branch misprediction misses, L1 cache misses, DERAT error and instruction cache misses. CPI stack program 510 determine microarchitecture dependent error rate values for these error types on a per instruction interval basis. For example, for a first instruction interval, CPI stack program 510 determines error rate values for the different error types. Subsequently, in a second instruction interval, CPI stack program 510 determines error rates values for the different error types. CPI stack program 510 continues this process of fine grain microarchitecture dependent error value determination for other instruction intervals until testing of the instruction intervals is complete.

Hardware registers 528 may also collect coarse grain microarchitecture dependent error information in real time, as per block 740. The coarse grain microarchitecture dependent information may be the same information as the fine grain microarchitecture dependent information, or other microarchitecture dependent information. However, hardware registers 528 collect and accumulate the coarse grain microarchitecture dependent information over the entire execution of workload program 590, again as per block 740. CPI stack program 510 populates CPI stack 525 upon completion of workload program 590 with coarse grain microarchitecture dependent information that hardware registers 528 collect during instruction execution, as per block 750.

CPI data are very significant measurement data for user and workload program analysis, such as the analysis of workload program 590. CPI data allow designers to evaluate the performance of software programs, such as workload program 590 that executes on IC design model 585. CPI data also provide an important reference for use in a comparison to determine if reduced representative workload program 595 functions and interacts with IC design model 585 in the same or similar manner as workload program 590. Although CPI data provide designers with key measurement information, other data such as microarchitecture dependent information of IC design model 585 may provide further useful information.

Along with CPI data, CPI stack program 510 collects microarchitecture dependent information on a per instruction basis of workload program 590. The CPI stack program may measure important microarchitecture dependent information, such as branch misprediction rates, L1 cache miss rates (such as those of L1 cache 521), DERAT miss rates, and instruction cache miss rates. Each microarchitecture dependent information error rate value results from the execution of workload program 590 interacting with microarchitecture hardware units of IC design model 585. CPI stack program 510 may sum CPI error rate data, branch misprediction error rate data, L1 cache miss error rate data, DERAT miss error rate data, and instruction cache miss error rate data in accordance with of Equation 1 below.

$$\text{Error rate} = (\text{CPI error rate} + \text{branch misprediction miss error rate} + L1 \text{ cache miss error rate} + \text{DERAT miss error rate} + \text{instruction cache miss error rate}) \quad \text{EQUATION 1}$$

CPI stack program 510 determines or calculates CPI error rate by generating an accumulation of CPI counts per instruction during a predetermined period, such as an instruction interval of workload program 590. In other words, CPI stack program 510 may determine the CPI error rate term of Equation 1 on a per instruction interval basis. CPI stack program 510 may determine the branch misprediction miss error rate, L1 cache miss error rate, DERAT miss error rate, instruction cache miss error rates, and other types of microarchitecture dependent errors, by evaluating miss rate errors for each the respective microarchitecture dependent units that correspond to each error. In other words, any interaction between workload program 590 and particular microarchitecture dependent units of IC design model 585 that cause a delay or CPI count form an error rate for that particular microarchitecture dependent unit.

One problem with the error metric determination of Equation 1 above is that each term of the equation exhibits a common or equal weight. In other words, for one example, the CPI error rate and the branch misprediction error rate have equal weight in the error rate that Equation 1 determines. To more properly weight microarchitecture dependent error rate information with CPI error rate data, CPI stack program 510 uses the CPI stack 525 analysis that CPI stack diagram 600 describes to provide a CPI percentage weight to each microarchitecture dependent information value type. To achieve a more desirable error rate indication, Equation 2 below provides a weighted error rate.

$$\begin{aligned}\text{Weighted error rate} = & (\text{CPI error rate}) + (\text{branch misprediction miss error rate value}) * (\text{branch misprediction error weight}) \\ & + (L1 \text{ cache miss error rate value}) * (L1 \text{ cache error weight}) \\ & + (\text{DERAT error rate value}) * (\text{DERAT error weight}) \\ & + (\text{instruction cache miss error rate value}) * (\text{instruction cache error weight}) \end{aligned} \quad \text{EQUATION 2}$$

wherein the weighted error rate is in "cycles per instruction".

In Equation 2 above, the CPI error rate term provides a base error rate value to which the remaining weighted terms of Equation 2 provide adjustment or fine tuning. The CPI error rate term of Equation 2 corresponds to column 610 of the CPI diagram of FIG. 6. In Equation 2 above, the branch misprediction miss error rate, the L1 cache miss error rate, the DERAT error rate and the instruction cache miss error rate are examples of different microarchitecture dependent error rate value types. Each of these error rate value types exhibits a corresponding error weight, namely a branch misprediction error weight, an L1 cache error weight, a DERAT error weight and an instruction cache error weight, respectively. The weighted error rate of Equation 2 may employ more or fewer terms than shown depending on the particular application and the degree of accuracy desired.

In the example of Equation 2 above, the weighted error rate equation multiplies each microarchitecture dependent information error rate value with a respective error weight. Prior to determining these error weights, CPI stack program 510 collects or stores coarse grain microarchitecture dependent error information for the different types of errors that occur during the execution of the entire workload program, namely all of the instruction intervals thereof, as per block 740. Hardware registers 528 may store this coarse grain microarchitecture dependent error information. The CPI stack program 510 populates CPI stack 525 with this coarse grain microarchitecture error information from hardware registers 528, as per block 750. CPI stack program 510 determines an error weight for each microarchitecture dependent error value type, as per block 755.

In one embodiment, the error weight of each microarchitecture dependent error value type is not known until CPI stack program 510 analyzes all of the instruction intervals of workload program 510. CPI stack program 510 may determine an error weight for each error type by a percentage calculation, as per block 760. For example, CPI stack program 510 may calculate branch misprediction miss error weight and other microarchitecture dependent error weights from microarchitecture dependent information during analysis of workload program 590. During execution of workload program 590, hardware registers 528 collect and store microarchitecture dependent error information for use by test system 500. CPI stack program 510 may calculate branch misprediction miss error data as CPI_BR_MPRED_PEN 630-4 of FIG. 6. CPI stack program 510 calculates CPI_BR_MPRED_PEN 630-4 to generate a CPI branch mispredict penalty data value of 0.034.

CPI stack program 510 may calculate the branch misprediction miss error weight of Equation 2 above, using the CPI branch mispredict penalty data value of 0.034 as a percentage of the total CPI for an average instruction of workload program 590, namely total CPI 610-1. By dividing the CPI_BR_MPRED_PEN 630-4 data value of 0.034 by the CPI 610-1 data value of 2.029, CPI stack program 510 generates a resultant branch misprediction miss error weight of 0.034/2.029 or 1.7%. Stated in another way, the branch misprediction miss error weight of 0.034 is 1.7% of the total CPI 610-1 data of 2.029 cycles per instruction (CPI) count of workload program 590 execution. The CPI stack 525 entries, as shown in CPI stack diagram 600, provide a CPI data percentage or weight for each type of microarchitecture dependent information error that occurs throughout the execution of all of the instruction intervals of workload program 510.

After weight determination, CPI stack program 525 may determine a respective weighted error rate for each instruction interval of workload program 590 by employing these weights as a percentage of the total CPI 610-1 data. Each instruction interval may exhibit a different microarchitecture data error rate value under Equation 2. However, each microarchitecture data error weight of Equation 2 represents one value only that CPI stack program 510 calculates after the execution of all instruction intervals of workload program 590. Each instruction interval may exhibit a different weighted error rate in accordance with Equation 2 above.

To form the reduced representative workload program 595 from the larger original workload program 590, in one embodiment, CPI stack program 510 selects a group of instruction intervals exhibiting low weighted error rates in comparison with the weighted error rates of other instruction intervals, as per block 770. For example, CPI stack program 510 may select a group of 10 instruction intervals from original workload program 590 that exhibit the 10 lowest weighted error rates that Equation 2 provides. CPI stack program 510 may select a larger or smaller number of instruction intervals depending on the particular application.

After processing in accordance with the method of FIG. 7, each instruction interval of workload program 590 exhibits a respective weighted error rate. CPI stack program 510 selects the most representative instruction intervals of workload program 590 from the collection of instruction intervals by selecting those instruction intervals that exhibit the lowest weighted error rates, as per Equation 2. In one example, to achieve a total representative workload program of 10 million instructions, CPI stack program 510 selects 10 instruction intervals using the above criteria to generate reduced representative workload program 595, as per block 770. In other words, CPI stack program 510 selects a predetermined number of instruction intervals that exhibit weighted error rates lower than the other remaining instruction intervals. The reduced representative workload program generation method ends, as per block 780. CPI stack program 510, designers and other entities may choose other representative workload program instruction interval sizes that may vary according to trade-offs, development time, test times, and other factors.

IC designers may predetermine which error rate data or microarchitecture dependent units to examine during execution of workload program 590. Designers or other entities may select such error rate data from the elements of Equation 2 above, the elements of CPI stack diagram 600, any microarchitecture dependent unit of IC design model 585, or other source. Designers or others may select instruction interval sizes, workload program instruction length sizes, or other parameters to accommodate test simulation time of reduced representative workload program 595 in test system 500.

The reduced representative workload 595 is representative of the larger workload program 590 even though reduced representative workload program 595 includes substantially fewer instructions than the larger workload program 590 from which it derives. In other words, when test system 500 executes reduced representative workload 595 on IC design model 585, test system 500 performs similarly to when test system 500 executes the original workload program 590. The more closely the reduced representative workload 595 approximates execution on IC design model 585 to workload program 590, the more efficient and effective the benchmarking process becomes.

The foregoing discloses methodologies wherein an IC design test system employs benchmark software to provide IC design personnel with IC design system tools for simulation, design benchmarking, and other analysis. In one embodiment, benchmarking software initiates multiple programs such as instruction trace, simulation point sampling, BBV generation, and K-Means clustering analysis. Designers may use the benchmark software tools in cooperation with CPI stack program tools to perform IC design model performance and benchmarking analysis.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of testing an integrated circuit (IC) design, comprising:

executing, by a simulator test system, a first workload program on an IC design model, the first workload program including instructions;

generating, by the simulator test system, basic block vectors (BBVs) while executing the first workload program, each BBV corresponding to a respective BBV instruction interval of the first workload program, thus defining a number of N instruction intervals;

clustering, by the simulator test system, the BBVs by program phase of the first workload program to form BBV clusters;

determining, by the simulator test system, a cycles per instruction (CPI) error rate on a per instruction interval basis to provide a base error rate;

storing, by the simulator test system, fine grain microarchitecture dependent error rate information that indicates microarchitecture dependent errors of different types that the simulator test system produces during the BBV instruction intervals of the first workload program, thus storing fine grain microarchitecture dependent error rate information for each of the N instruction intervals;

storing, by the simulator test system, coarse grain microarchitecture dependent error rate information that indicates microarchitecture dependent errors of different types that the simulator test system produces during execution of the entire first workload program, and generating, by the simulator test system, a weighted error rate including the cycles per instruction (CPI) error rate as the base error rate, the weighted error rate further including weighted fine grain microarchitecture dependent error rate information and weighted coarse grain microarchitecture dependent error rate information.

2. The method of claim 1, wherein generating a weighted error rate includes generating, by the simulator test system, respective error rate values for the different types of microarchitecture dependent errors for a BBV instruction interval of the first workload program.

3. The method of claim 2, wherein the microarchitecture dependent error rate types include one of branch misprediction misses, L1 cache misses, data effective to real address translation (DERAT) errors and instruction cache misses.

4. The method of claim 2, wherein generating a weighted error rate further includes executing, by the simulator test system, the BBV instruction intervals of the first workload program to determine a respective weight for each microarchitecture dependent error rate type.

5. The method of claim 4, wherein generating a weighted error rate further includes summing the cycles per instruction (CPI) error rate with the product of a microarchitecture dependent error rate value exhibiting a particular error rate type and the respective weight for that particular error rate type.

6. The method of claim 5, wherein the generating a weighted error rate is repeated for the BBV instruction intervals of the first workload program to provide respective weighted error rates for the instruction intervals of the first workload program.

7. The method of claim 6, further comprising generating a second reduced workload program from the first workload program by selecting a predetermined number of BBV instruction intervals that exhibit lower weighted error rates than other of the BBV instruction intervals.

8. An integrated circuit (IC) design model simulator test system comprising:
 a processor;
 a memory store, coupled to the processor, the memory store including an IC design model and a first workload program including instructions, the memory store being configured to:
  execute the first workload program on the IC design model;
  generate basic block vectors (BBVs) while executing the first workload program, each BBV corresponding to a respective BBV instruction interval of the first workload program, thus defining a number of N instruction intervals;
  cluster the BBVs by program phase of the first workload program, to form BBV clusters;
  determine a cycles per instruction (CPI) error rate on a per instruction interval basis to provide a base error rate;
  store fine grain microarchitecture dependent error rate information that indicates microarchitecture dependent errors of different types that the simulator test system produces during the BBV instruction intervals of the first workload program, thus storing fine grain microarchitecture dependent error rate information for each of the N instruction intervals;
  store coarse grain microarchitecture dependent error rate information that indicates microarchitecture dependent errors of different types that the simulator test system produces during execution of the entire first workload program, and
  generate a weighted error rate including the cycles per instruction (CPI) error rate as the base error rate, the weighted error rate further including weighted fine grain microarchitecture dependent error rate information and weighted coarse grain microarchitecture dependent error rate information.

9. The IC design model simulator test system of claim 8, wherein to generate the weighted error rate the memory store is further configured to generate respective error rate values for the different types of microarchitecture dependent errors for a BBV instruction interval of the first workload program.

10. The IC design model simulator test system of claim 9, wherein the microarchitecture dependent error rate types include one of branch misprediction misses, L1 cache misses, data effective to real address translation (DERAT) errors and instruction cache misses.

11. The IC design model simulator test system of claim 9, wherein to generate the weighted error rate the memory store is further configured to execute the BBV instruction intervals of the first workload program to determine a respective weight for each microarchitecture dependent error rate type.

12. The IC design model simulator test system of claim 11, wherein to generate the weighted error rate the memory is further configured to sum the cycles per instruction (CPI) error rate with the product of a microarchitecture dependent error rate value exhibiting a particular error rate type and the respective weight for that particular error rate type.

13. The IC design model simulator test system of claim 12, wherein the memory is further configured to generate a respective weighted error rate for the BBV instruction intervals of the first workload program.

14. The IC design model simulator test system of claim 13, wherein the memory is further configured to generate a second reduced workload program from the first workload program by selecting a predetermined number of BBV instruction intervals that exhibit lower weighted error rates than other of the BBV instruction intervals.

15. A computer program product stored on a computer operable storage medium, comprising:
 instructions that execute the first workload program on the IC design model;
 instructions that generate basic block vectors (BBVs) while executing the first workload program, each BBV corresponding to a respective BBV instruction interval of the first workload program, thus defining a number of N instruction intervals;
 instructions that cluster the BBVs by program phase of the first workload program to form BBV clusters;
 instructions that determine a cycles per instruction (CPI) error rate on a per instruction interval basis to provide a base error rate;
 instructions that store fine grain microarchitecture dependent error information that indicates microarchitecture dependent errors of different types that the simulator test system produces during the BBV instruction intervals of the first workload program, thus storing fine grain microarchitecture dependent error rate information for each of the N instruction intervals;
 instructions that store coarse grain microarchitecture dependent error rate information that indicates microarchitecture dependent errors of different types that the simulator test system produces during execution of the entire first workload program, and
 instructions that generate a weighted error rate including the cycles per instruction (CPI) error rate as the base error rate, the weighted error rate further including weighted fine grain microarchitecture dependent error rate information and weighted coarse grain microarchitecture dependent error rate information.

16. The computer program product of claim 15, wherein the instructions that generate the weighted error rate include instructions that generate respective error rate values for the different types of microarchitecture dependent errors for a BBV instruction interval of the first workload program.

17. The computer program product of claim 16, wherein the instructions that generate the weighted error rate include instructions to execute the BBV instruction intervals of the first workload program to determine a respective weight for each microarchitecture dependent error rate type.

18. The computer program product of claim 17, wherein the instructions that generate the weighted error rate include instructions to sum the cycles per instruction (CPI) error rate with the product of a microarchitecture dependent error rate value exhibiting a particular error rate type and the respective weight for that particular error rate type.

19. The computer program product of claim 18, further comprising instructions to generate a respective weighted error rate for the BBV instruction intervals of the first workload program.

20. The computer program product of claim 19, further comprising instructions to generate a second reduced workload program from the first workload program by selecting a predetermined number of BBV instruction intervals that exhibit lower weighted error rates than other of the BBV instruction intervals.

* * * * *